United States Patent [19]

Smith et al.

[11] Patent Number: 5,049,653

[45] Date of Patent: Sep. 17, 1991

[54] WIDEBAND BUFFER AMPLIFIER WITH HIGH SLEW RATE

[75] Inventors: Steven O. Smith; Kerry A. Thompson, both of Fort Collins, Colo.

[73] Assignee: Comlinear Corporation, Ft. Collins, Colo.

[21] Appl. No.: 554,275

[22] Filed: Jul. 17, 1990

Related U.S. Application Data

[63] Continuation of Ser. No. 305,789, Feb. 2, 1989, abandoned.

[51] Int. Cl.$^5$ .............................................. H03F 3/30
[52] U.S. Cl. ..................................... 330/267; 330/263
[58] Field of Search ............... 330/257, 263, 267, 265, 330/273, 288, 299

[56] References Cited

U.S. PATENT DOCUMENTS 4,833,424  5/1989  Wright ................................. 330/267

FOREIGN PATENT DOCUMENTS 4106  1/1989  Japan ................................... 330/252

Primary Examiner—James B. Mullins
Attorney, Agent, or Firm—Sheridan, Ross & McIntosh

[57] ABSTRACT

A wideband buffer is described which has improved slew rate over prior buffers. In one embodiment the buffer includes (a) complementary buffer subcircuit, (b) first and second current mirrors to bias the buffer subcircuit in a cross coupled manner, and (c) means of setting a stable quiescent operating point for the circuit.

24 Claims, 11 Drawing Sheets

5,049,653

WIDEBAND BUFFER AMPLIFIER WITH HIGH SLEW RATE

This is a continuation of application Ser. No. 07/305,789, filed Feb. 2, 1989, and now abandoned.

FIELD OF THE INVENTION

This invention relates to buffer amplifiers. More particularly, this invention relates to a buffer amplifier topology that offers improvement over prior art buffer amplifiers.

BACKGROUND OF THE INVENTION

Buffers are general purpose building blocks that are used extensively in electronic circuits. Buffers are used as stand alone circuitry in impedance transformation, as subcircuits in amplifier output stages and amplifier input stages, and in many other applications. In circuits processing signals with high slew rate, the slew rate of a buffer can limit overall performance.

SUMMARY OF THE INVENTION

The invention provides a buffer with a slew rate which is in principle only limited by the current carrying capability of the transistors used, and in practice much higher than prior art buffers. The invention achieves high slew rates without the excessive quiescent currents usually required in high slew rate circuits.

The wideband buffer amplifier of the present invention has utility in various areas, such as:

(1) stand alone buffer for impedance transformation
(2) output stage subcircuit in an amplifier
(3) input stage subcircuit in an amplifier The present invention provides an improved wideband buffer amplifier with high slew rate. The buffer amplifier comprises:

(a) a unity gain buffer amplifier including an input terminal and an output terminal;
(b) first and second dependent bias means; and
(c) first and second slew current sensing means.

When a variable voltage is applied to the input terminal, the first slew current sensing means is adapted to sense a rate of increase in the voltage and is further adapted to cause the first dependent bias means to be increased in proportion to said rate of increase in the voltage. The second slew current sensing means is adapted to sense a rate of decrease in the voltage and is further adapted to cause the second dependent bias means to be increased in proportion to the rate of decrease in the voltage.

In a specific embodiment the buffer amplifier of the invention comprises:

(a) complementary buffer subcircuit, which includes a high impedance input, a low impedance output, and two slew sensing outputs;
(b) first and second current mirrors to bias the buffer subcircuit, connected in a cross coupled manner such that the positive slew current sense output of the buffer subcircuit is connected to the input of the positive current mirror, and the output of the positive current mirror is connected to the positive bias point of the buffer subcircuit; the negative slew current sense output of the buffer subcircuit is connected to the input of the negative current mirror, and the output of the negative current mirror is connected to the negative bias point of the buffer subcircuit;
(c) means of setting a stable quiescent operating point for the circuit, which includes a reference which controls the quiescent currents in the rest of the circuit.

BRIEF DESCRIPTION OF THE DRAWINGS

The invention is described in more detail hereinafter with reference to the accompanying drawings where like reference characters refer to the same parts throughout the several views and in which.

DETAILED DESCRIPTION OF THE ILLUSTRATED EMBODIMENTS OF THE INVENTION

In the following discussion:

$Ic_{xx}$ is the collector current of transistor xx, defined positive into the transistor.

$Ie_{xx}$ is the emitter current of transistor xx, defined positive into the transistor.

$M_{xx}$ is the gain of current mirror xx. Current mirror gain is defined to be positive, the ratio of the current flowing from the output (O) divided by the current flowing from the input (I).

$Is_{xx}$ is the charging current in capacitor xx, defined positive flowing into the capacitor.

$I_{xx}$ is the current in source xx, with indicated polarity.

$CM_{xx}$ is a current mirror constructed by any of the means known in the art. Current mirrors have an input terminal and an output terminal, indicated in the figures by I and O respectively. Current mirrors also have internal connections to sources of voltage supply. For a more complete description of current mirrors and their characteristics, see *Analysis and Design of Analog Integrated Circuits*, by Paul R. Gray and Robert G. Meyer, 2nd Edition, incorporated herein by reference.

In the following description, base current is assumed small enough to neglect in order to simplify the descriptions. However, means of analyzing base current are well known to those versed in the art of transistor circuit design.

Figure 1:
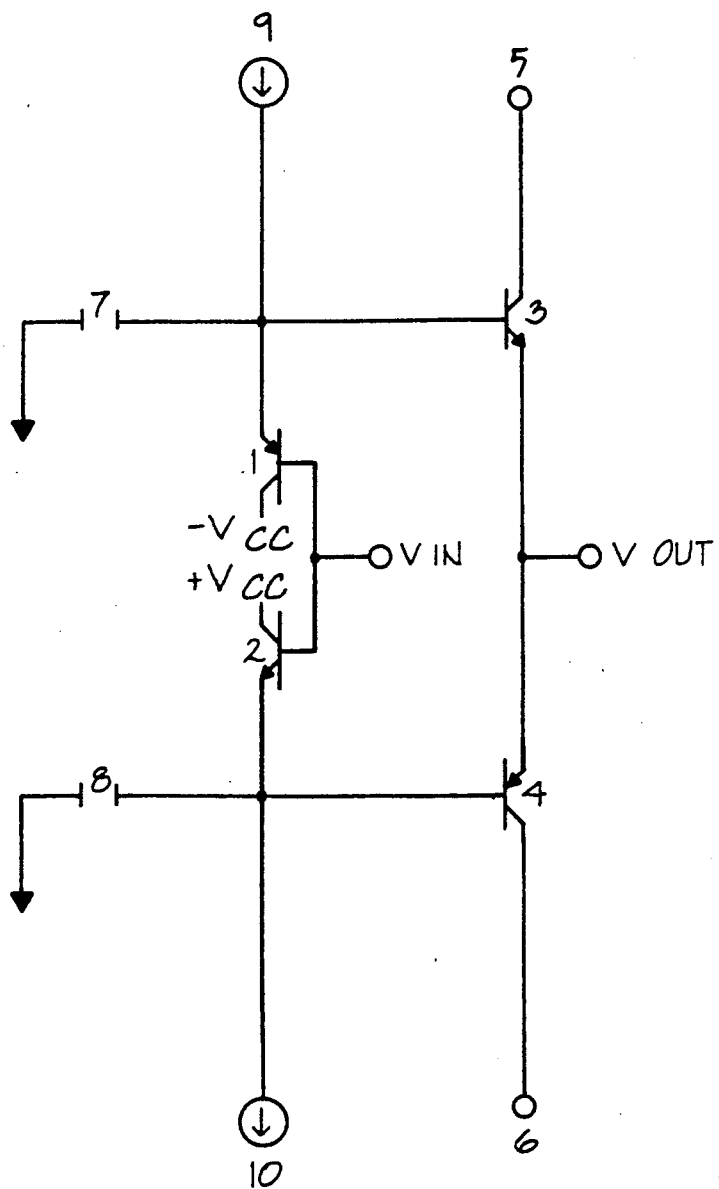
FIGS. 1 and 2 show prior art buffer circuits.

In FIG. 1, there is shown a unity gain buffer circuit constructed in accordance with the prior art. Bias sources 9 and 10 control bias currents in transistors 1 and 2. Terminals 5 and 6 are connected to sources of bias for transistors 3 and 4. Transistors 3 and 4 bias at a current determined by the matching between transistors 1 and 4, 2 and 3, and the load current leaving the node labeled Vout. If transistors 1 and 4, 2 and 3 are well matched, transistors 3 and 4 bias at the geometric mean of the collector currents flowing in transistors 1 and 2 (assuming no loading at the terminal labeled Vout). The output voltage, Vout, tracks the input voltage, Vin, as the input voltage is varied slowly.

In the prior art cases where the circuit of FIG. 1 is used as a stand alone buffer or as an output stage, terminals 5 and 6 are connected to voltage sources. In the prior art cases where the circuit of FIG. 1 is used as the input stage of an amplifier, terminals 5 and 6 are connected to gain circuits, such as described in U.S. Pat.

No. 4,780,689, FIG. 1, incorporated herein by reference.

Capacitors 7 and 8 of FIG. 1 model the effect of various parasitic circuit elements, including those due to layout, capacitance to substrate, collector-base capacitance, and other sources. Capacitors 7 and 8 are shown connected to ground, but it will be clear to one versed in the art that they may be connected to any AC ground (such as a supply voltage). Applying a rapidly rising voltage at Vin causes the voltages at the emitters of transistors 1 and 2 to rise rapidly, which causes capacitors 7 and 8 to charge by means of the currents available at the emitters of transistors 1 and 2. The charging current to capacitor 8 acts to increase the magnitude of the current flowing in the emitter of transistor 2, which is only limited by the source impedance of Vin and transistor 2 current gain. The charging current to capacitor 7 acts to decrease the current flowing in the emitter of transistor 1. Since the emitter current of transistor 1 cannot become negative in this connection, the maximum charging current to capacitor 7 is limited to the current coming out of bias source 9, which is a fixed amount of current. Letting the output current of bias source 9 be defined as I9, and doing a current sum at the emitter of transistor 1, $$Ie1 = I9 - Is7$$

which must be greater than or equal to zero. The maximum Is7 is achieved when Ie1=0, $$Is7(max) = I9$$

From the current-voltage relationship for a capacitor, $$Is7 = C7 * \frac{dV7}{dt}$$

where V7 is the voltage across and C7 the capacitance value of capacitor 7. The dV7/dt term in the above equation is the derivative of V7 with respect to time, and is commonly used as the definition for slew rate (at C7). The maximum slew rate for a rising voltage can now be expressed:

$$\frac{dV7(max)}{dt} = \frac{Is7(max)}{C7} = \frac{I9}{C7} \quad (1)$$

If the voltage at Vin rises more rapidly than this slew rate, the charging current to capacitor 7 will equal the bias current flowing out of bias source 9, and a slew limiting condition will occur. The charging current to capacitor 7 causes transistor 1 to shut off, and the voltage at Vout will no longer track the input. A similar statement can be made for a rapidly falling voltage at Vin causing slew limiting to occur at the emitter of transistor 2.

Figure 2:
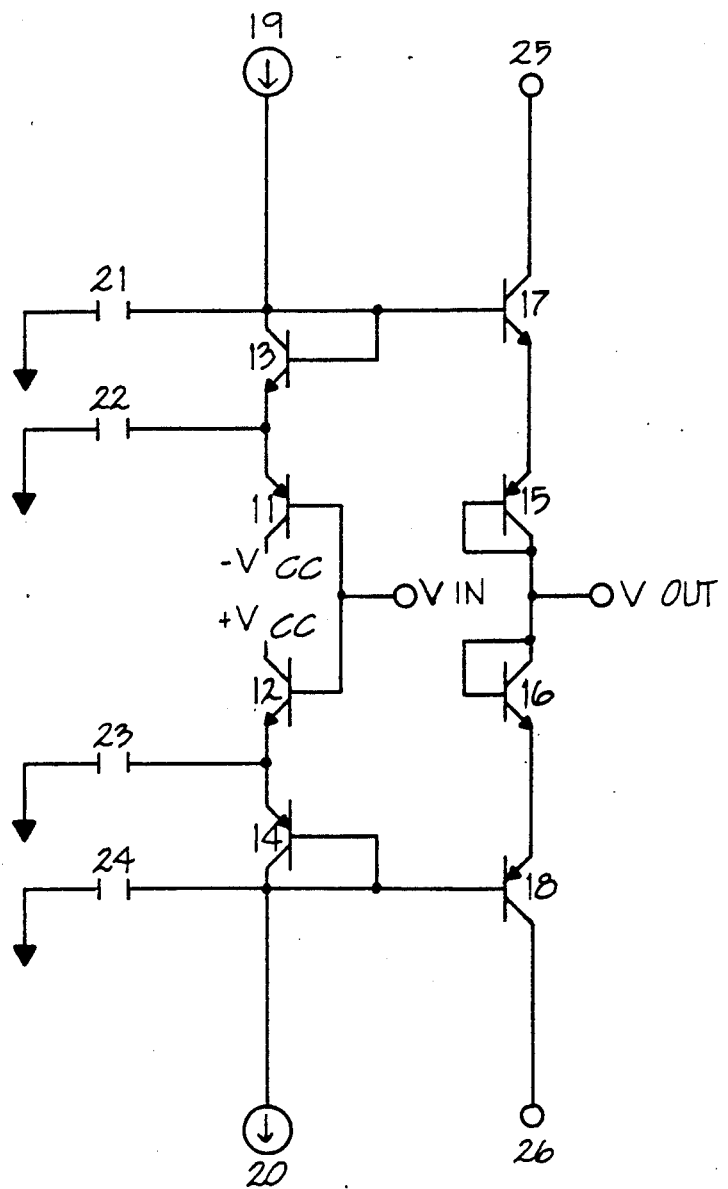

Referring now to FIG. 2, which shows a different prior art buffer circuit (described in U.S. Pat. No. 4,639,685), a similar slew limiting situation can be seen to apply. For a rapidly rising Vin, capacitors 23 and 24 charge rapidly, their charging current causing the emitter current of transistor 12 to increase. The charging currents of capacitors 21 and 22 cause the emitter current of transistor 11 to decrease, and a slew limiting condition is reached when the charging currents of capacitors 21 and 22 equal the current supplied to transistor 11 emitter by bias source 19, causing transistor 11 to shut off.

Equation (1) shows that there are two ways to increase maximum (limiting) slew rate in FIGS. 1 and 2. Decreasing the capacitances in FIGS. 1 and 2 will increase the maximum slew rates. Usually, the capacitances have already been reduced as far as possible, and the capacitances cannot be reduced to increase slew rate. Alternatively, quiescent currents (I9 and I10 in FIG. 1, I19 and I20 in FIG. 2) can be increased. Maximum slew rate will increase directly with increased quiescent current. Increasing quiescent current has serious drawbacks. It causes increased quiescent power dissipation in the buffer circuit, and also increases base currents in the transistors connected to node Vin (increasing base currents decreases the accuracy of the buffer).

Figure 3:
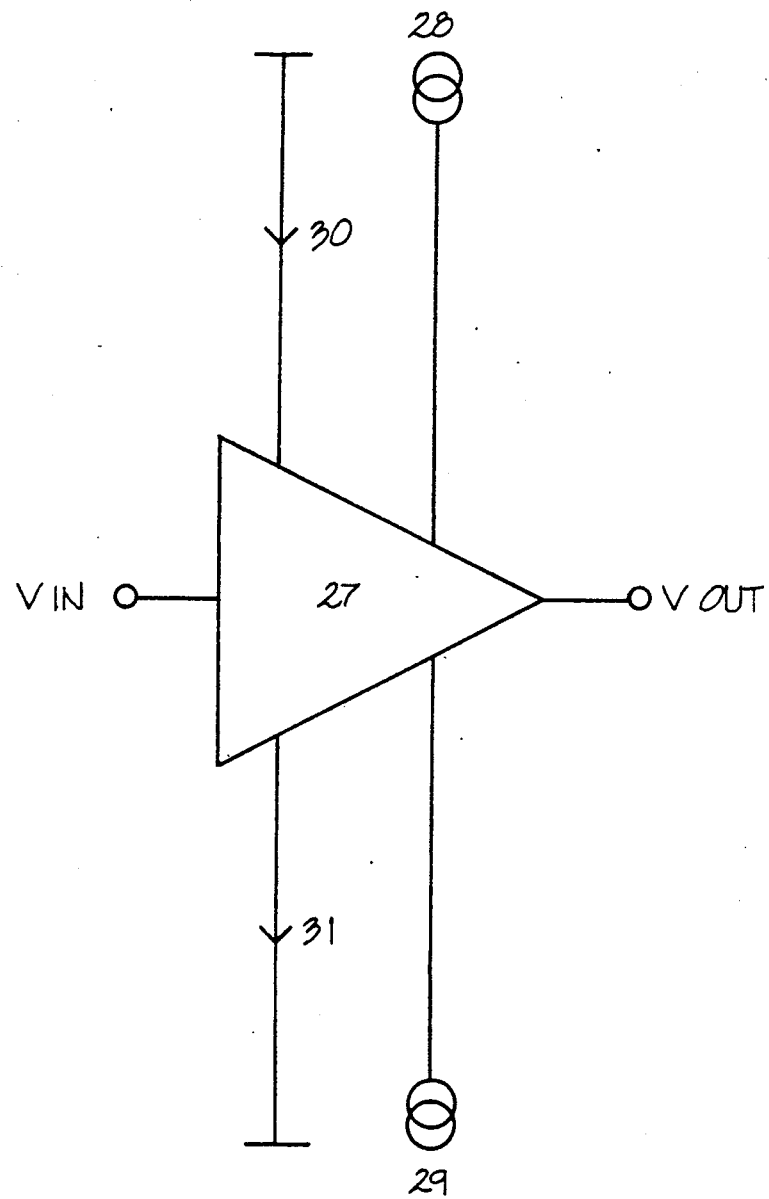
FIG. 3 shows a wideband buffer circuit of the invention.

In FIG. 3 is shown the most general form of the invention. This comprises a unity gain buffer amplifier 27, positive slew sense line 30, negative slew sense line 31, and dependent bias sources 28 and 29. The values of dependent bias sources 28 and 29 are proportional to the value of slew sense lines 30 and 31 respectively. Means of setting a stable operating point is implicit in the manner of dependency chosen between bias sources 28, 29, and slew senses 30, 31. For clarity in the figure, slew rate limiting capacitances are assumed internal to buffer amplifier 27. Also not shown in FIG. 3, but assumed present internal to buffer amplifier 27, are additional terminals (such as terminals 5 and 6 in FIG. 1) connected to voltage sources or to gain circuits.

The operation of FIG. 3 is now explained. Applying a rapidly rising signal at Vin causes the value of the positive slew sense line 30 to increase, which causes the value of bias source 28 to increase proportionately. Applying a rapidly falling signal at Vin causes the value of the negative slew sense line 31 to increase, which causes the value of bias source 29 to increase proportionately. The current available to slew buffer amplifier 27 in a positive direction is determined by the value of bias source 28. Similarly, the current available to slew buffer amplifier 27 in a negative direction is determined by the value of bias source 29. As signals with large positive and negative slew rate are applied at Vin, bias sources 28 and 29 are increased in proportion to the slew rate. Equation (1) still applies, but the current to charge parasitic, slew rate limiting capacitances is only present when needed. The circuit of FIG. 3 has much higher slew rate than the circuits of FIGS. 1 and 2, without large quiescent currents.

Figure 4:
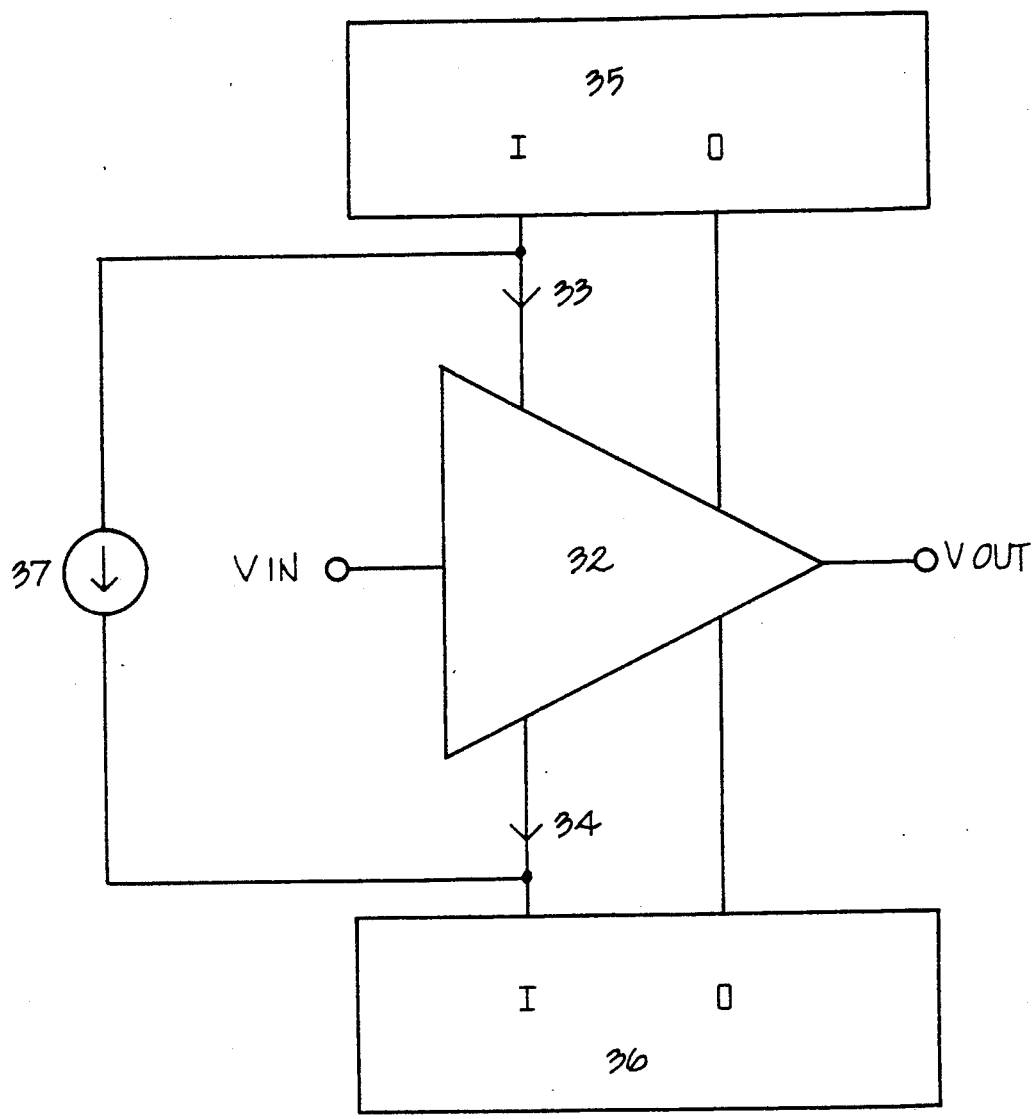
FIG. 4 shows another embodiment of the buffer circuit of the invention.

In FIG. 4 there is shown one implementation of the invention. This comprises a unity gain buffer amplifier, 32, with slew sensing lines 33 and 34. The buffer amplifier 32 is biased by means of current mirrors 35 and 36. Included in current mirrors 35 and 36 are sources of voltage supply as is known in the prior art. The bias for buffer amplifier 32 is dependent on the current flowing in slew sensing lines 33 and 34, and also on the value of source 37, which is a means of providing quiescent current. Means of setting a stable operating point is implicit in the choice of gain of current mirrors 35 and 36.

Parasitic capacitances (not shown in FIG. 4) at the output of current mirrors 35 and 36 would normally limit slew rate except for the action of the invention, which will now be explained. Applying a rapidly rising signal at Vin causes the value of the positive slew sense line 33 to increase in proportion to the slew rate of Vin, which causes the value of current flowing in the input of CM35 to increase proportionately. The output current of CM35 will also increase in proportion to the slew rate of Vin. If the increase in the output current of CM35 equals the current required to charge the capacitance at the output of CM35, the bias current delivered to buffer amplifier 32 by CM35 will not be disturbed, and a slew limiting condition will not occur. A similar argument can be seen to apply for a rapidly falling signal applied at Vin, affecting the current in CM36. It is important to note that the removal of the slew rate limitation normally caused by the parasitic capacitances at the output of the current mirrors is not affected by the choice of quiescent operating current. The slew rate limitation caused by current mirror output capacitance is completely removed, given the correct choice of current mirror gains.

Figure 5:
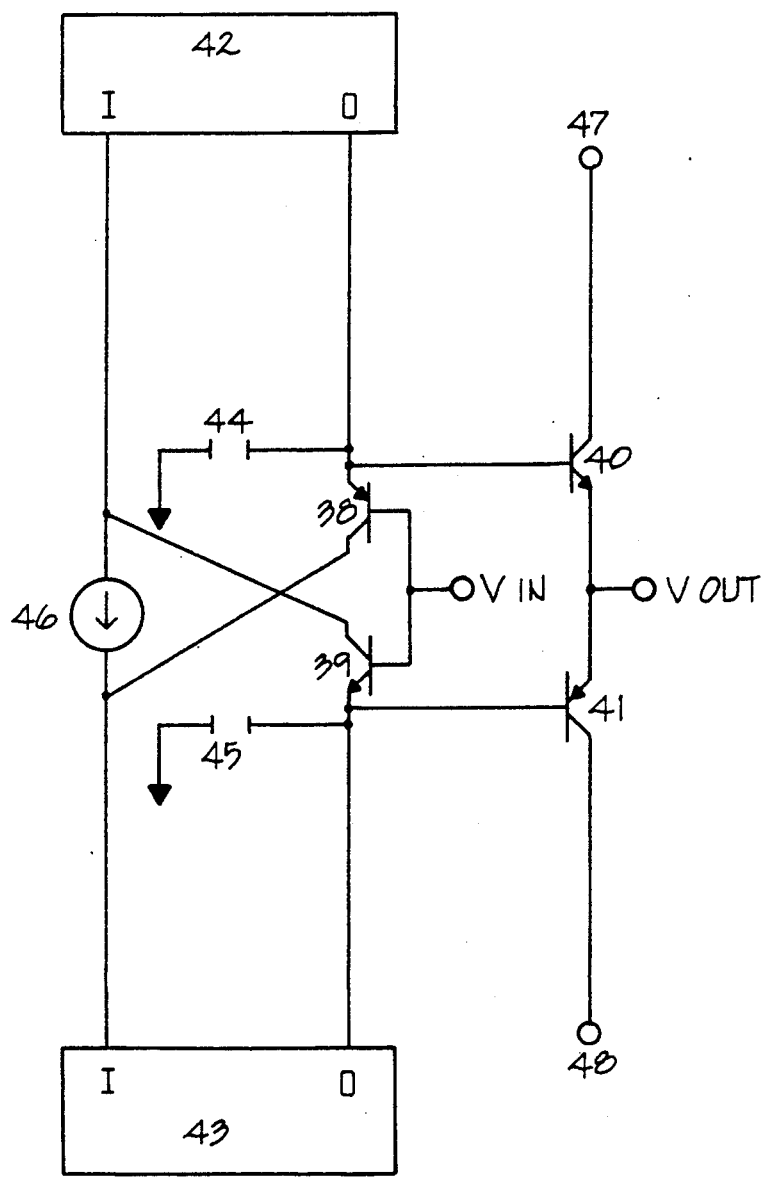
FIG. 5 shows another embodiment of the buffer circuit of the invention.

In FIG. 5 is shown one implementation of the present invention. Transistors 39 and 40 are NPN, and transistors 38 and 41 are PNP. Bias sources, slew sense lines, and means of setting a stable operating point are implemented with current mirrors 42 and 43. Included in current mirrors 42 and 43 are sources of voltage supply as is known in the prior art. As in FIG. 1, 47 and 48 are connected to sources of bias, which may be voltage sources or gain circuits as discussed previously. Also as in FIG. 1, transistors 40 and 41 bias at the geometric mean of the collector currents flowing in transistors 38 and 39 (assuming transistors 38 and 41, 39 and 40 are well matched). The bias for transistors 38 and 39 is obtained from the current source 46, the bias currents of transistors 39 and 38, and the charging currents of capacitors 44 and 45 respectively. Transistor 38 supplies some of the bias current for transistor 39, and transistor 39 supplies some of the bias current for transistor 38. This cross coupling of the bias currents places stability constraints on the gain of current mirrors 42 and 43. The constraints can be derived by solving for the collector currents Ic38 and Ic39 under quiescent conditions (capacitor charging currents Is44 and Is45=0). Collector current in transistor 39 is the negative of the emitter current in transistor 39, which is determined by the gain of current mirror 43 and input currents to current mirror 43. This can be analyzed as follows:

$$Ic39 = M43*(I46 - Ic38) \quad (2)$$

$$Ic38 = -M42*(I46 + Ic39) \quad (3)$$

Combining equations (2) and (3), $$Ic39 = M43*(I46 + M42*(I46 + Ic39))$$

$$Ic39 = I46* \frac{M43*(1 + M42)}{1 - M42*M43}$$

Similarly, $$Ic38 = -M42*(I46 + M43*(I46 - Ic38))$$

$$Ic38 = -I46* \frac{M42*(1 + M43)}{1 - M42*M43}$$

If M42*M43 equals or exceeds 1, current flow in the circuit no longer has a stable quiescent operating point. For this reason, care must be taken in design to keep M42*M43 less than one across frequency. This guarantees that the quiescent bias points of transistors 38 and 39 will be stable.

The effects of applying a rapidly changing signal at Vin in FIG. 5 are markedly different from those effects in FIG. 1. The cross coupling between slew current sensing and transistor biasing causes the current charging the slew limiting node to increase by the amount required to keep the node from limiting slew rate (in a correctly designed implementation of the invention). The nodes which normally limit slew rate no longer do so, and much higher slew rates are achieved without increased quiescent currents.

The detailed operation of FIG. 5 is now explained. If a rapidly rising signal is applied at Vin in FIG. 5, the charging current of capacitor 45 acts to increase the magnitude of the current flowing in the emitter of transistor 39. The current increase is equal to the charging current of capacitor 45 within the limits of Vin source impedance and transistor 39 current gain.

The increased magnitude of emitter current of transistor 39 flows through the collector of 39 and into the input of current mirror 42. The increased current is then reflected by current mirror 42 to capacitor 44. The increased current in CM42 caused by capacitor 45 aids the charging current of capacitor 44. The net effect on transistor 38 is to decrease the emitter current by a much smaller amount than in FIG. 1. In FIG. 1, Is7 acted directly to reduce the emitter current of transistor 1. In FIG. 5, the emitter current of transistor 38 is reduced by Is44−M42*Is45. If capacitors 44 and 45 are equal, and M42 approaches unity, the emitter current of transistor 38 will stay approximately fixed. Since the emitter current of transistor 38 is approximately fixed, the cross coupling provided by current mirror 43 to transistor 39 does not affect the emitter current of transistor 39.

The effect of a rapidly rising signal at Vin in FIG. 5 is to increase the output of current mirror 42 by the amount needed to charge capacitor 44. Perfect cancellation of charging currents of the two capacitors is not possible due to the stability constraint. Approximate cancellation is practical (by making M42*M43 close to 1, but not equal to 1), giving greatly increased slew rate.

A similar statement can be seen to apply for a falling voltage applied at Vin causing the output of current mirror 43 to increase by the amount needed to charge capacitor 45. Slew limit for the circuit in FIG. 5 is much larger than the slew limit for the circuit in FIG. 1. In the case where capacitors 44 and 45 are not equal, a small amount of capacitance may be added to the appropriate node in order to make the capacitors equal, or the gain of the two current mirrors can be adjusted.

Figure 6:
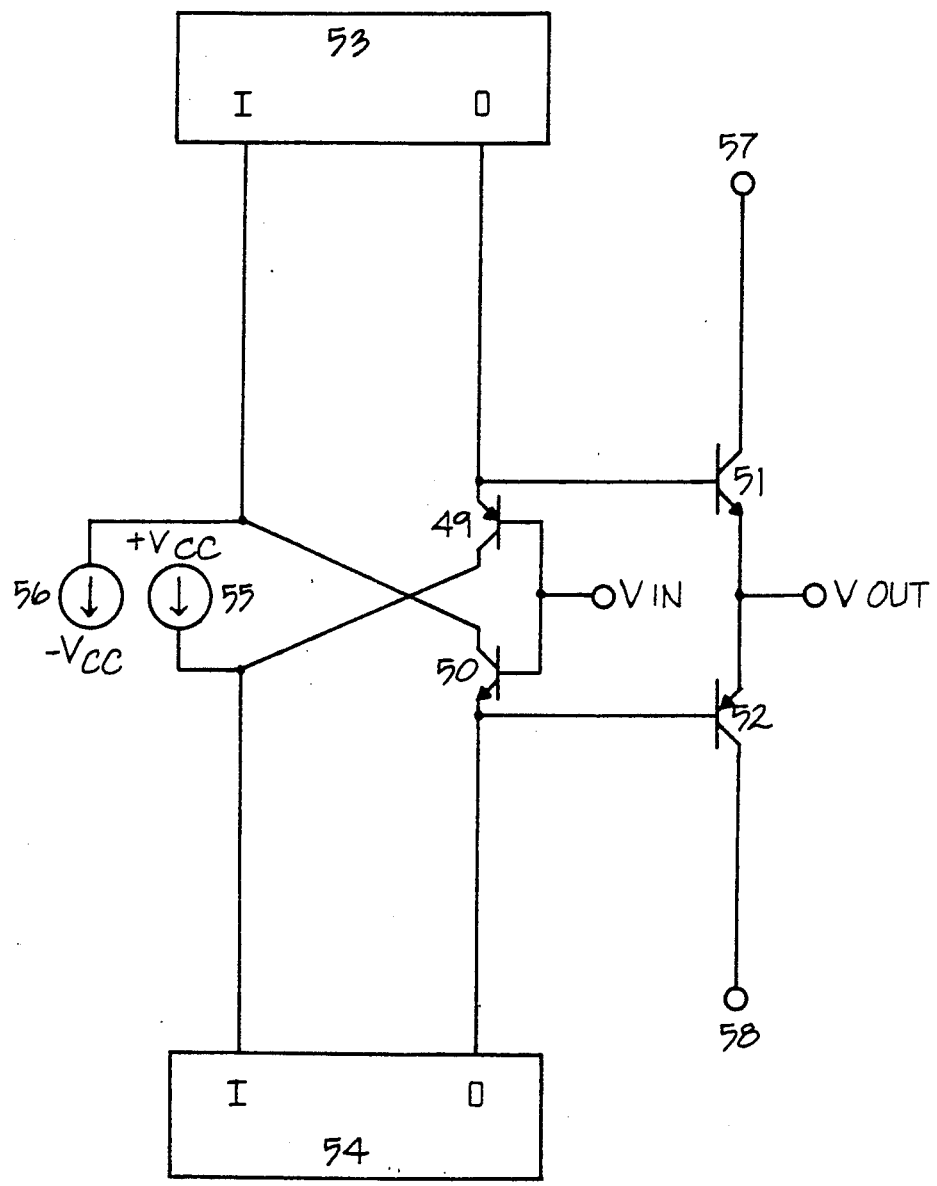
FIGS. 6-11 show still other embodiments of buffer circuits of the invention.

FIG. 6 shows another implementation of the invention. Transistors 50 and 51 are NPN, and transistors 49 and 52 are PNP. As in previous circuits 57 and 58 are connected to sources of bias, which may be gain circuits. Included in current mirrors 53 and 54 are sources of voltage supply as is known in the prior art. The stability constraint for FIG. 6 is the same as that for FIG. 5. This can be seen by solving for the collector currents of transistors 49 and 50.

$$Ic50 = M54*(I55 - Ic49) \quad (4)$$

$$Ic49 = -M53*(I56 + Ic50) \quad (5)$$

Combining equations (4) and (5), $$Ic50 = M54*(I55 + M53*(I56 + Ic50))$$

$$Ic50 = \frac{I55*M54 + I56*M53*M54}{1 - M53*M54}$$

Similarly, $$Ic49 = -M53*(I56 + M54*(I55 - Ic49))$$

$$Ic49 = \frac{-I55*M53*M54 - I56*M53}{1 - M53*M54}$$

As found in the analysis of FIG. 5, the multiplication of the current mirror gains in FIG. 6, M53*M54, must be less than 1 in order for the circuit to have a stable quiescent operating point.

Figure 7:
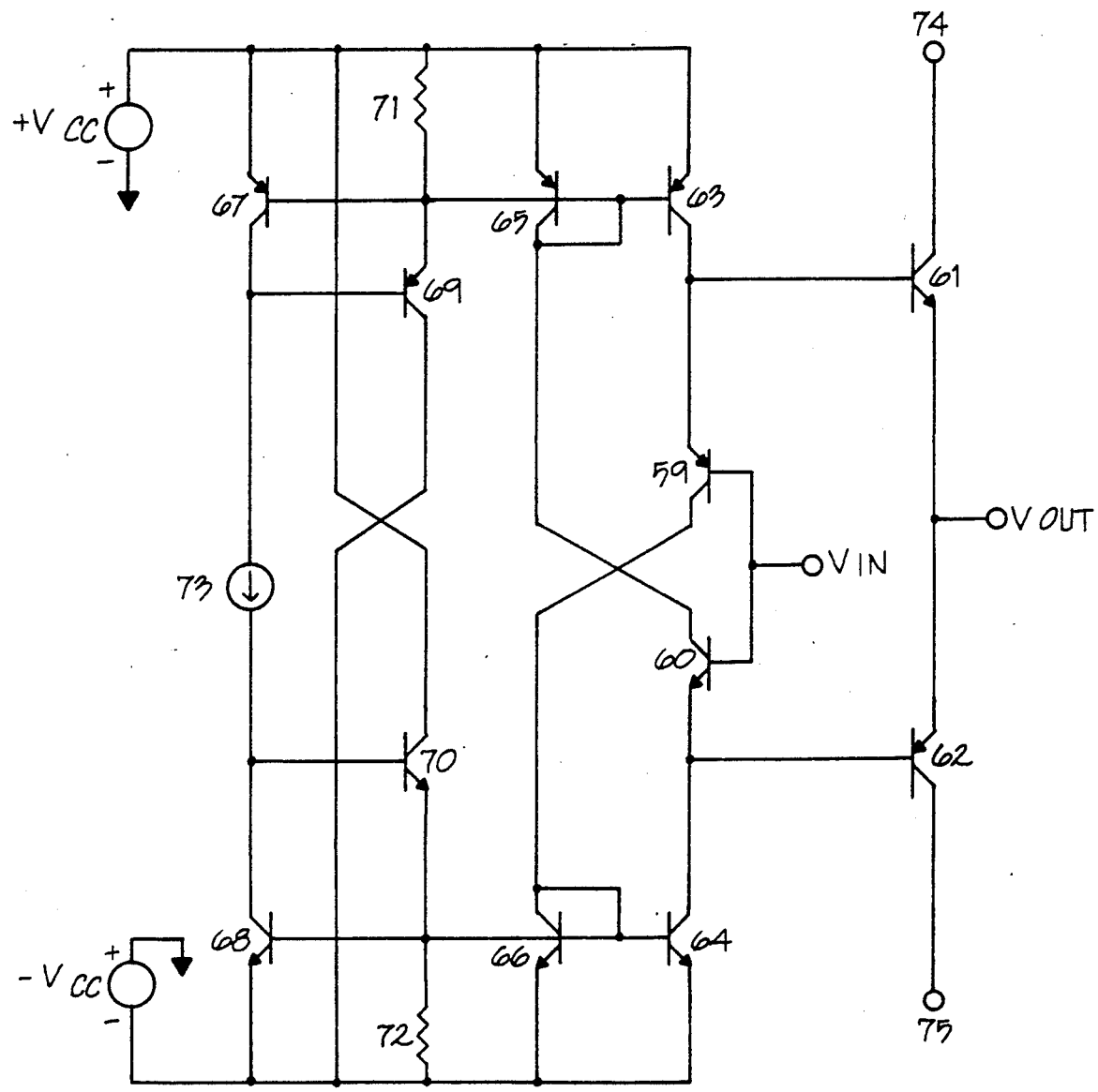

In FIG. 7 is shown one implementation of the present invention. Transistors 60, 61, 64, 66, 68, and 70 are NPN, and transistors 59, 62, 63, 65, 67, and 69 are PNP. This circuit is similar to that of FIG. 5, with modified current mirrors. In analogy to FIG. 5, transistors 63 and 65 make up the positive side current mirror, and transistors 64 and 66 make up the negative side current mirror. Also shown are voltage sources +Vcc and -Vcc, providing sources of voltage supply as is known in the prior art.

Modified from FIG. 5 is the manner in which quiescent reference current is supplied. The reference current (73) now is applied through additional transistors 67, 69, 68, 70. Transistors 69 and 70 buffer the reference current (73) from the base currents of transistors 63, 65, 64, 66. Resistors 71 and 72 provide bias for transistors 69 and 70. The bias point for transistors 69 and 70 should be chosen such that the base currents of transistors 69 and 70 are small compared to the value of current 73. With a correctly chosen bias point for transistors 69 and 70, the effect of transistors 69 and 70 is to buffer the quiescent reference current 73 from base currents in the current mirrors (transistors 63, 65, 64, 66). This provides a more accurate quiescent operating point for the circuit.

The operation of the circuit of FIG. 7 with rapidly changing Vin is now explained. Consider first the positive side circuitry (transistors 63, 65, 67, 69). As long as transistor 69 is operating in the forward active region (FAR) with positive emitter current, the voltage at the base of transistors 63, 65, and 67 is approximately fixed at the level caused by I73 flowing through transistor 67.

For the crosscoupling of the transistors 59 and 60 to take effect, transistor 69 must be changed from operating in FAR to operating in the cutoff region, with the collector current approaching zero. The manner in which this occurs will now be explained. If a rapidly rising signal is applied at Vin, parasitic capacitance at the emitter of transistor 60 (not shown in FIG. 7) is rapidly charged within the limitations of source impedance and transistor 60 current gain. This causes the collector current of transistor 60 to increase. As long as transistor 69 is in FAR, the base voltage of transistor 65 is held fixed, and the collector currents of transistors 65 and 63 are held constant. The increased current in Ic60 flows through resistor 71, which acts to decrease the emitter current of transistor 69. For rapid enough changes in Vin, transistor 69 is cutoff with appoximately zero emitter current by the increase in Ic60, and any increases in Ic60 above the amount needed to cut off transistor 69 flow through transistor 65, enabling the cross coupling and corresponding increase in current flowing out of transistor 63 to aid charging of capacitance at the emitter of transistor 59.

A further improvement in accuracy can be achieved by applying the modification of quiescent reference current supply shown in FIG. 7 to a circuit in which the current mirrors are Wilson current mirrors instead of simple current mirrors. This circuit is shown in FIG. 8.

Figure 8:
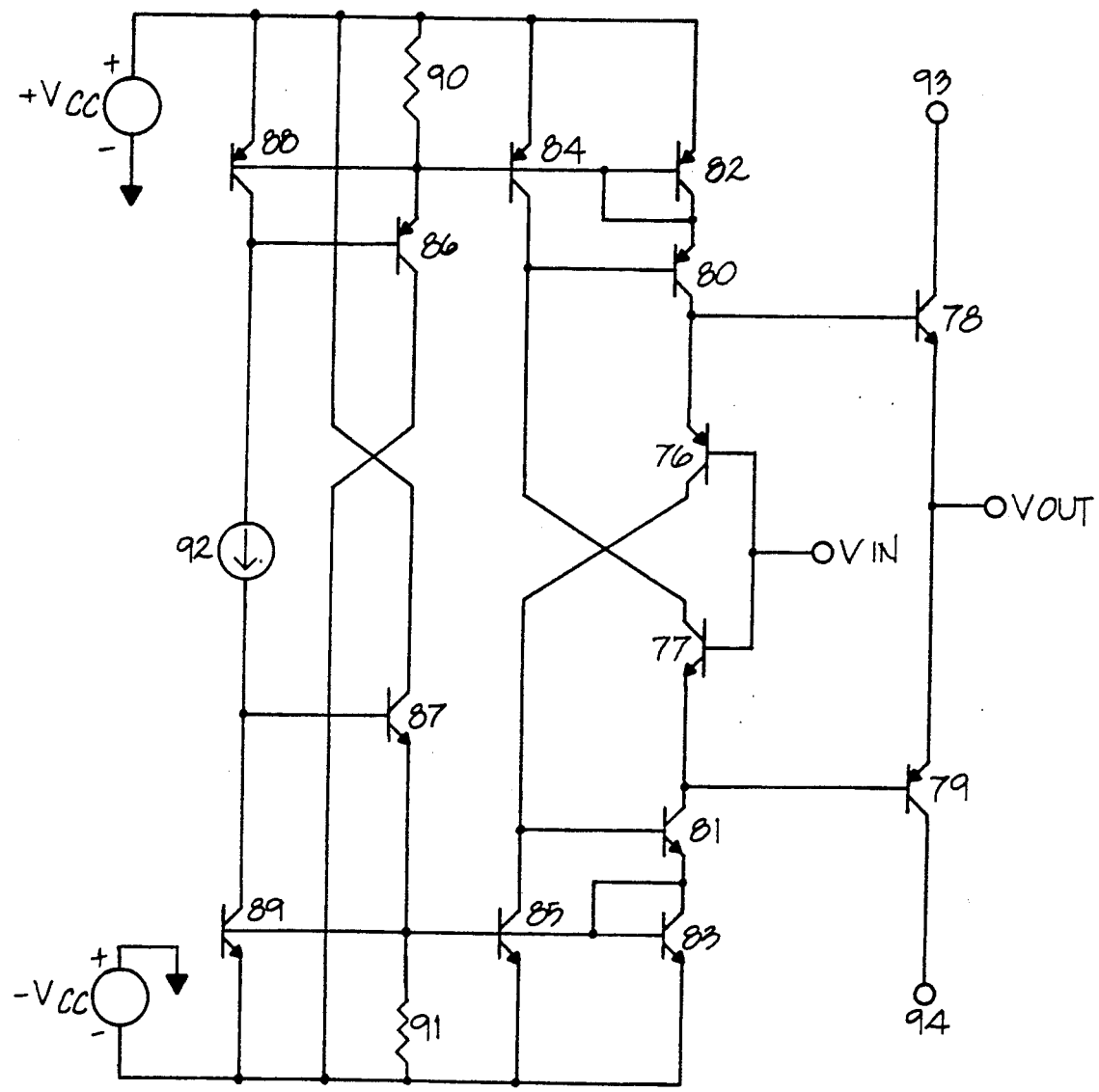

In FIG. 8 is shown another implementation of the present invention. Transistors 77, 78, 81, 83, 85, 87, and 89 are NPN, and transistors 76, 79, 80, 82, 84, 86, and 88 are PNP. This circuit is similar to that of FIG. 7, with modified current mirrors. In FIG. 7, the current mirrors consisted of transistors 63, 65, 64, 66, forming two simple current mirrors. In FIG. 8, the two simple current mirrors are replaced with two Wilson current mirrors constructed of transistors 80, 82, 84, 81, 83, 85. The operation of the circuit of FIG. 8 to rapidly changing Vin is similar to the operation of the circuit of FIG. 7. Improvements over FIG. 7 can be seen by examining the effects of base current in FIGS. 7 and 8.

First examine the effects of base current in FIG. 7. As long as base current buffering transistors 69, 70 are in FAR, the base currents of the current mirrors are buffered from the reference current. When a rapidly increasing Vin causes the operating point of transistors 69 and 70 to change to the cutoff region as discussed previously, the base currents of transistors 63 and 65 cause the output of the simple current mirror formed by transistors 63, 65 to be in error by approximately the sum of Ib63 and Ib65, as is known in the prior art. This base current error affects the accuracy of the cancellation of charging currents in parasitic capacitors provided by the cross coupling of the current mirrors. This error affects the accuracy of the slew current cancellation, and affects the maximum achievable slew rate.

Now examine the effect of base current in the circuit of FIG. 8. As in the circuit of FIG. 7, as long as base current buffering transistors 86, 87 are in FAR, the base currents of the current mirrors are buffered from the reference current. When a rapidly increasing Vin causes the operating point of transistors 86 and 87 to change to the cutoff region as discussed previously, the remaining transistors contributing to base current errors are transistors 80, 82, 84 forming a Wilson current mirror. If the gain of the current mirror is chosen to be unity, the base current errors of transistors 80, 82, and 84 cancel out, as is known in the prior art. This provides a much more accurate cancellation of charging currents in parasitic capacitors than the cancellation provided by the circuit of FIG. 7, and therefore provides a greater maximum achievable slew rate.

Figure 9:
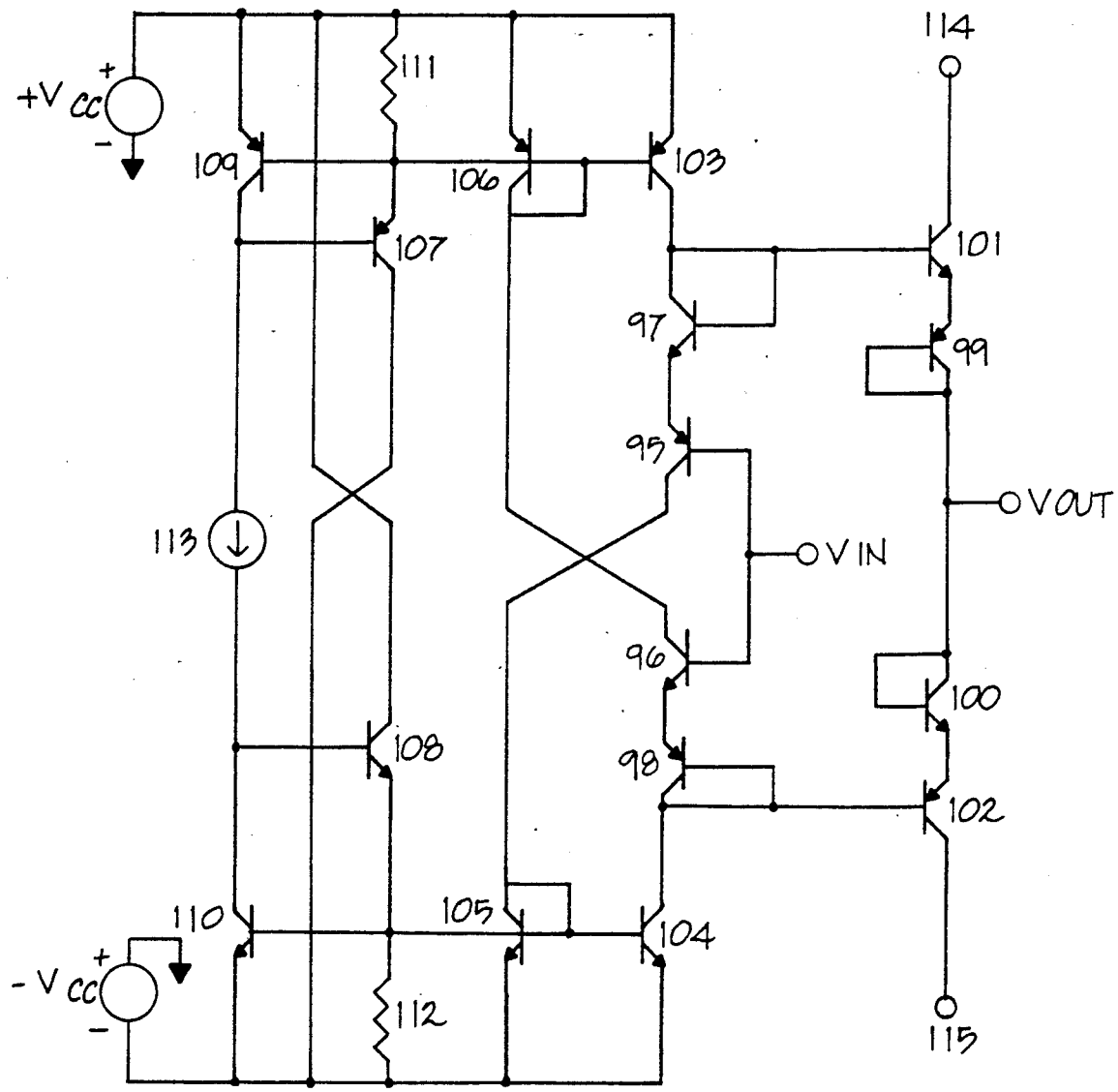

The implementations of the invention shown in FIGS. 5, 6, 7, and 8 all use a simple four transistor buffer subcircuit. The circuits in FIGS. 5, 6, 7, and 8 can also be implemented using the eight transistor buffer subcircuit shown in FIG. 2. FIG. 9 illustrates the circuit of FIG. 7 using an eight transistor buffer subcircuit.

Figure 10:
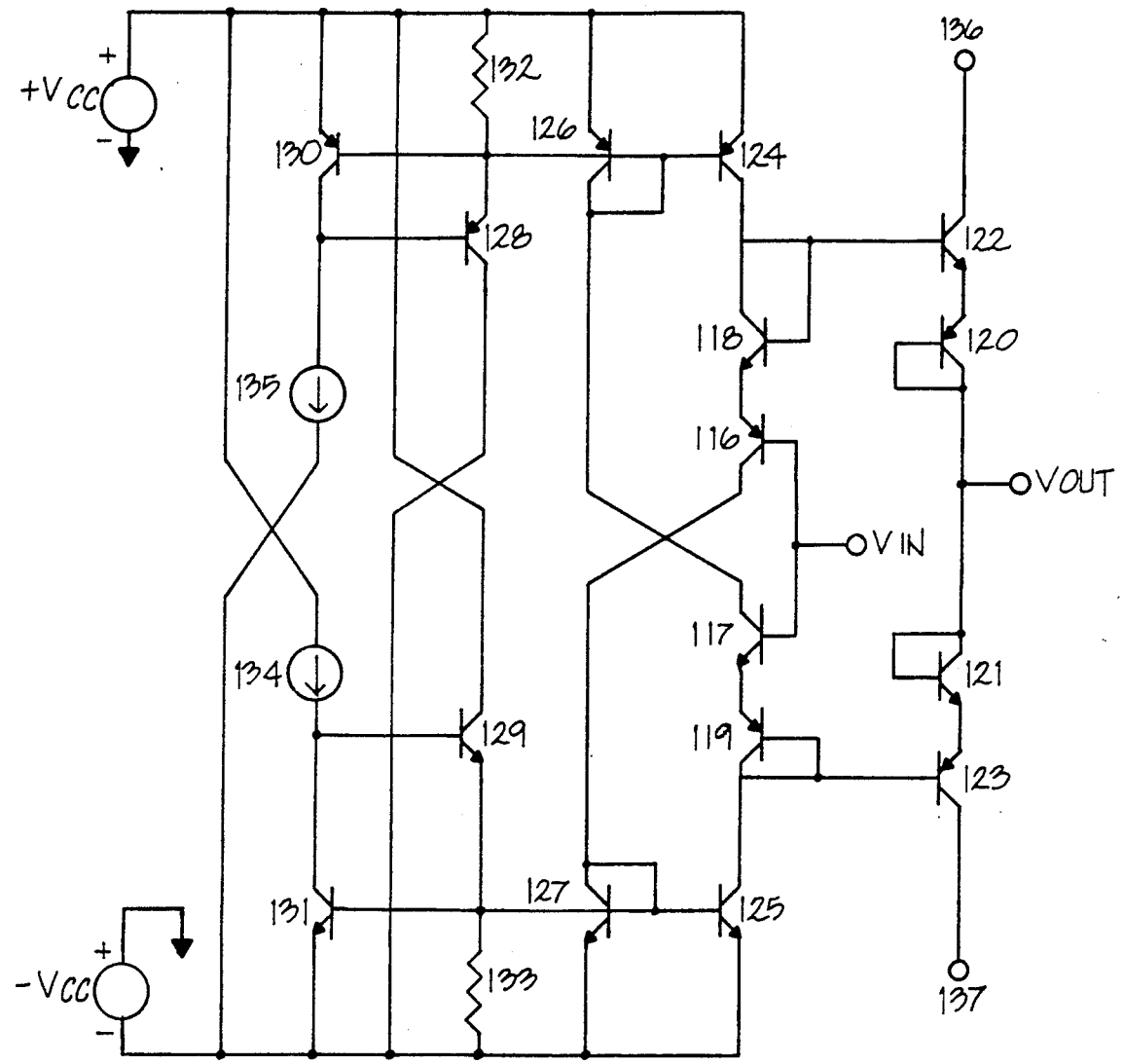

It will also be clear to one versed in the art that the modification made in going from FIG. 5 to FIG. 6 can also be utilized in the circuit of FIG. 7. The single current source in FIG. 7 can be split into two independent sources. FIG. 10 illustrates the addition of a second reference current to the circuit of FIG. 9. The function of FIGS. 9 and 10 can easily be seen by comparing them with previous figures.

Figure 11:
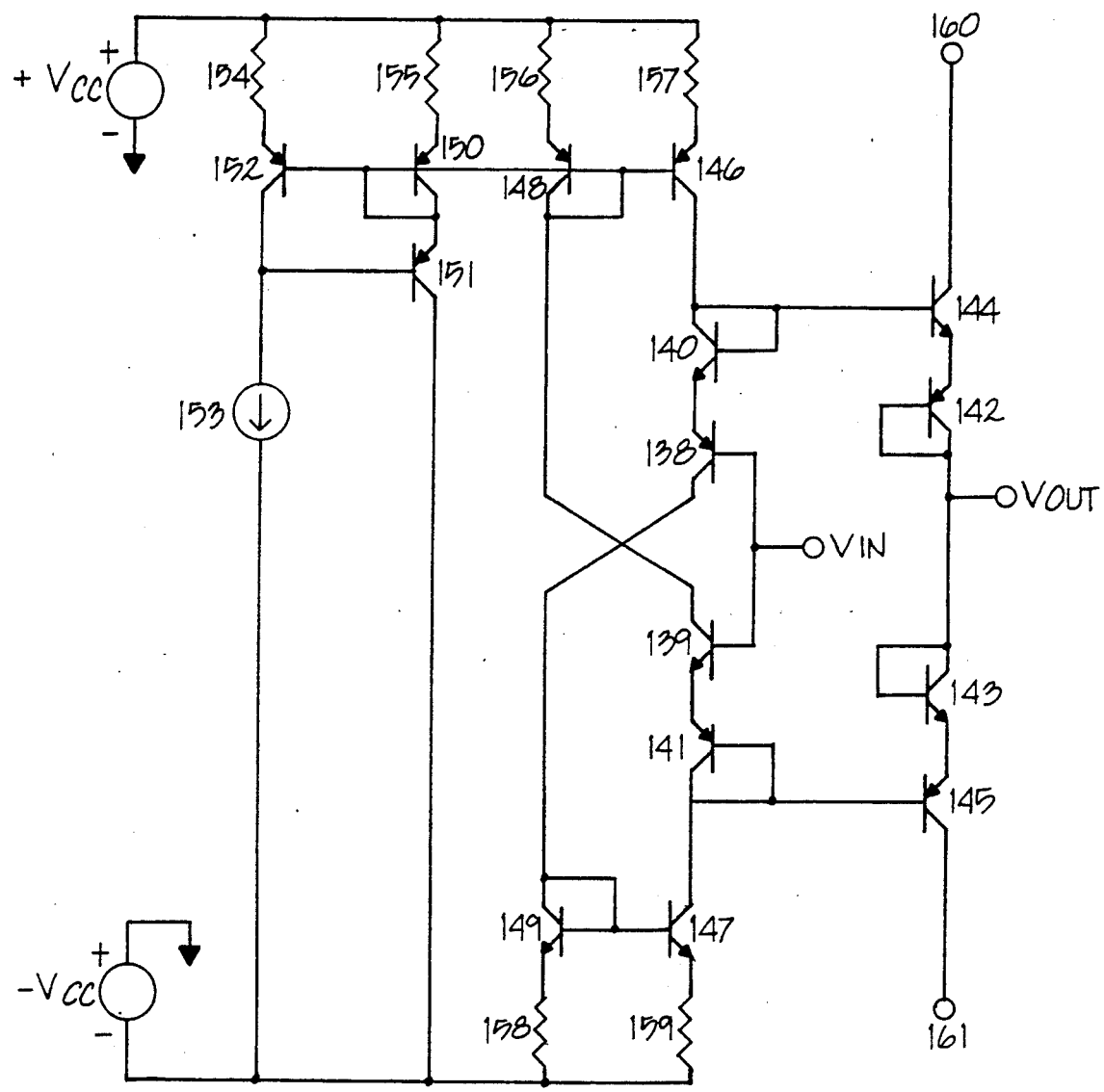

The circuit of FIG. 11 operates in a manner similar to previous circuits. Transistors 139, 140, 143, 144, 147 and 149 are NPN, and transistors 138, 141, 142, 145, 146, 148, 150, 151 and 152 are PNP. FIG. 11 is a simplified form of FIG. 10, as can be seen from the following discussion. In FIG. 10, quiescent operating conditions are established by two independent reference currents, 134 and 135. Setting current 134 to zero eliminates the need for transistors 129 and 131, and for resistor 133. Eliminating current source 134, transistors 129 and 131, and resistor 133 results in the circuit of FIG. 11. Quiescent operating conditions are established by current 153, and the action of this circuit when Vin is rapidly changing is essentially the same as that of FIG. 7. Added from FIG. 10 are resistors 154–159 and transistor 150. The addition of resistors 154–159 is conventionally done in prior art current mirrors primarily to improve matching. The resistors may have a value of zero. The addition of transistor 150 is to provide a more stable bias current in transistor 151. This technique is also known in the prior art.

The embodiments of the present invention have been described above in terms of NPN and PNP bipolar transistors. However, other embodiments based upon other types of transistors, and other slight modifications of the devices taught herein, will be immediately clear to one skilled in the art of circuit design. These other transistor devices include, but are not limited to, junction field-effect transistors (JFETS), insulated gate field effect transistors (FETS) of either enhancement or depletion mode, MESFETS, vacuum tubes of any number of elements, and devices compounded of simpler transistor devices, such as Darlington transistors, parallel transistors, and diode-connected transistors.

For the purpose of this invention and the appending claims, reference to "transistor" shall include any electronic devices, simple or compound, having at least common, input, and output terminals, and constructed so that a current flowing through said output terminal to said common terminal is responsive to a voltage difference existing at said input terminal with respect to said common terminal. Additionally, reference herein to "emitter", "base", and "collector" terminals of said transistor shall be construed to apply to said common, input, and output terminals of said electronic device. For example, a field-effect transistor includes gate, source and drain terminals which correspond, respectively, to the base, emitter and collector terminals of a bipolar transistor.

In the language of the claims hereto appended, distinction is made to the polarity of transistor devices as "NPN transistor" or "PNP transistor". Reference to "NPN transistor" shall be construed to apply to any transistor device as described above wherein the output terminal is biased at a voltage above that of the common terminal under normal operating conditions. Conversely, "PNP transistor" shall be construed to apply to any transistor device wherein the output terminal is biased at a voltage below that of the common terminal under normal operating conditions. For example, "NPN transistor" shall apply as well to a bipolar NPN transistor as to an n-channel field-effect transistor. Similarly, "PNP transistor" shall apply as well to a bipolar PNP transistor as to a p-channel field-effect transistor.

Additionally, as used herein, the term "diode" includes any electronic device having at least common and input terminals, and which is constructed such that the voltage-current characteristic of said common terminal with respect to said input terminal matches the voltage-current characteristic of the common terminal with respect to the input terminal of a transistor. It will be apreciated by one skilled in the art that diodes may be substituted in place of any or all of the diode-connected transistors (those transistors with base connected to collector, such as 140, 141, 142, 143, 148, 149, 150 of FIG. 11). For proper operation of the present invention, the substituting diode device should be reasonably matched to the transistor it replaces, as has been described above.

Additionally, it will be appreciated by one versed in the art that resistors, or any means of providing bias current may be substituted for the current sources in the figures. Also, the buffer subcircuit may be any unity gain buffer, providing input, output, slew current sense terminals, and slew rate limited by bias currents.

What is claimed is:
1. A wideband buffer amplifier, comprising:
a unity gain buffer amplifier including an input terminal and an output terminal;
first and second dependent bias means each including at least one input terminal and an output terminal;
wherein each said dependent bias means further includes at least one source of voltage supply;
wherein said output terminals of said first and second dependent bias means are connected to provide bias current to said unity gain buffer amplifier;
first and second slew current sensing means;
bias source for providing means of setting quiescent current;
said bias source being connected to one said input terminal of at least one said dependent bias means;
wherein said first and second slew current sensing means are connected to one said input terminal of said first and second dependent bias means, respectively;
wherein when a variable voltage is applied to said input terminal of said unity gain buffer amplifier, said first slew current sensing means is adapted to sense a rate of increase in said voltage and is further adpated to cause said first dependent bias means to be increased in proportion to said rate of increase in said voltage, and said second slew current sensing means is adapted to sense a rate of decrease in said voltage and is further adapted to cause said second dependent bias means to be increased in proportion to said rate of decrease in said voltage;
wherein said first and second dependent bias means comprise, respectively, first and second current mirrors, each having an input terminal and an output terminal;
wherein said buffer amplifier includes first, second, third and fourth transistors each having collector, emitter and base terminals and first and second bias sources;
wherein said base terminals of said first and second transistors are connected together to form said input terminal of said amplifier;
wherein said emitter terminal of said first transistor is connected to said base terminal of said third transistor;
wherein said emitter terminal of said second transistor is connected to said base terminal of said fourth transistor;
wherein said emitter terminals of said third and fourth transistors are connected to form said output terminal of said amplifier;
wherein said collector terminal of said third transistor is connected to said first bias source;

wherein said collector terminal of said fourth transistor is connected to said second bias source;
wherein said collector terminal of said first transistor is connected to said input terminal of said second current mirror;
wherein said collector terminal of said second transistor is connected to said input terminal of said first current mirror;
wherein said output terminal of said first current mirror is directly connected to said emitter terminal of said first transistor; and
wherein said output terminal of said second current mirror is directly connected to said emitter terminal of said second transistor.

2. A wideband buffer amplifier in accordance with claim 1, wherein said first and second bias sources comprise bias voltage sources.

3. A wideband buffer amplifier, comprising:
a unity gain buffer amplifier including an input terminal and an output terminal;
first and second dependent bias means each including first and second input terminals and an output terminal;
wherein each said dependent bias means further includes at least one source of voltage supply;
wherein said output terminals of said first and second dependent bias means are connected to provide bias current to said unity gain buffer amplifier;
first and second slew current sensing means;
bias source for providing means of setting quiescent current;
said bias source being connected to said first input terminal of each said dependent bias means;
wherein said first and second slew current sensing means are connected to said second input terminals of said first and second dependent bias means, respectively;
wherein when a variable voltage is applied to said input terminal of said unity gain buffer amplifier, said first slew current sensing means is adapted to sense a rate of increase in said voltage and is further adapted to cause said first dependent bias means to be increased in proportion to said rate of increase in said voltage, and said second slew current sensing means is adapted to sense a rate of decrease in said voltage and is further adapted to cause said second dependent bias means to be increased in proportion to said rate of decrease in said voltage;
wherein each said dependent bias means includes first, second, third, and fourth transistors each having collector, base, and emitter terminals;
wherein each said dependent bias means includes bias current means for said fourth transistor;
wherein, in each said dependent bias means, said base terminals of said first, second and third transistors are connected together with said collector terminal of said second transistor and with said emitter terminal of said fourth transistor and with said bias current means to form said second input terminal of each said dependent bias means;
wherein said collector terminal of said third transistor is connected to said base terminal of said fourth transistor to form said first input terminal of each said dependent bias means;
wherein said collector terminal of said first transistor comprises said output terminal of each said dependent bias means;

wherein there are first and second sources of voltage supply;
wherein said emitter terminals of said first, second, and third transistors of said first dependent bias means are connected to said first source of voltage supply and said collector terminal of said fourth transistor of said first dependent bias means is connected to said second source of voltage supply;
wherein said emitter terminals of said first, second, and third transistors of said second dependent bias means are connected to said second source of voltage supply and said collector terminal of said fourth transistor of said second dependent bias means is connected to said first source of voltage supply; and
wherein said first and second sources of voltage supply are adapted to bias said transistors.

4. A wideband buffer amplifier in accordance with claim 3, wherein:
said bias current means for said fourth transistor of said first dependent bias means comprises resistor means connected to said first source of voltage supply and said bias current means for said fourth transistor of said second dependent bias means comprises resistor means connected to said second source of voltage supply.

5. A wideband buffer amplifier comprising:
a unity gain buffer amplifier including an input terminal and an output terminal;
first and second dependent bias means each including first and second input terminals and an output terminal;
wherein each said dependent bias means further includes at least one source of voltage supply;
wherein said output terminals of said first and second dependent bias means are connected to provide bias current to said unity gain buffer amplifier;
first and second slew current sensing means;
bias source for providing means of setting quiescent current;
said bias source being connected to said first input terminal of each said dependent bias means;
wherein said first and second slew current sensing means are connected to said second input terminals of said first and second dependent bias means, respectively;
wherein when a variable voltage is applied to said input terminal of said unity gain buffer amplifier, said first slew current sensing means is adapted to sense a rate of increase in said voltage and is further adapted to cause said first dependent bias means to be increased in proportion to said rate of increase in said voltage, and said second slew current sensing means is adapted to sense a rate of decrease in said voltage and is further adapted to cause said second dependent bias means to be increased in proportion to said rate of decrease in said voltage;
wherein each said dependent bias means includes first, second, third, fourth and fifth transistors, each having collector, base, and emitter terminals;
wherein each said dependent bias means includes bias current means for said fourth transistor;
wherein in each said dependent bias means said base terminals of said first, second and third transistors are connected together with said collector terminal of said first transistor and with said emitter terminal of said fourth transistor and with said emitter terminal of said fifth transistor and with said bias current means;

wherein said base terminal of said fifth transistor is connected to said collector terminal of said second transistor to form said second input terminal of each said dependent bias means;

wherein said collector terminal of said third transistor is connected to said base terminal of said fourth transistor to form said first input terminal of each said dependent bias means;

wherein said collector terminal of said fifth transistor comprises said output terminal of each said dependent bias means;

wherein there are first and second source of voltage supply;

wherein said emitter terminals of said first, second, and third transistors of said first dependent bias means are connected to said first source of voltage supply and said collector terminal of said fourth transistor of said first said dependent bias means is connected to said second source of voltage supply;

wherein said emitter terminals of said first, second, and third transistors of said second dependent bias means are connected to said second source of voltage supply and said collector terminal of said fourth transistor of said second dependent bias means is connected to said first source of voltage supply; and wherein said first and second sources of voltage supply are adapted to bias said transistors.

6. A wideband buffer amplifier in accordance with claim 5, wherein said bias current means for said fourth transistor comprises resistor means connected to said first source of voltage supply.

7. A wideband buffer amplifier, comprising:
a unity gain buffer amplifier including an input terminal and an output terminal;
first and second dependent bias means each including at least one input terminal and an output terminal;
wherein each said dependent bias means further includes at least one source of voltage supply;
wherein said output terminals of said first and second dependent bias means are connected to provide bias current to said unity gain buffer amplifier;
first and second slew current sensing means;
bias source for providing means of setting quiescent current;
said bias source being connected to one said input terminal of at least one said dependent bias means;
wherein said first and second slew current sensing means are connected to one said input terminal of said first and second dependent bias means, respectively;
wherein when a variable voltage is applied to said input terminal of said unity gain buffer amplifier, said first slew current sensing means is adapted to sense a rate of increase in said voltage and is further adapted to cause said first dependent bias means to be increased in proportion to said rate of increase in said voltage, and said second slew current sensing means is adapted to sense a rate of decrease in said voltage and is further adapted to cause said second dependent bias means to be increased in proportion to said rate of decrease in said voltage;
wherein said first and second dependent bias means comprise, respectively, first and second current mirrors, each having an input terminal and an output terminal;

wherein said buffer amplifier includes first, second, third, fourth, fifth, sixth, seventh, and eighth transistors each having collector, emitter, and base terminals, and first and second bias sources;
wherein said first, fourth, fifth, and eighth transistors are of the PNP type;
wherein said second, third, sixth, and seventh transistors are of the NPN type;
wherein said base terminals of said first and second transistors are connected together to form said input terminal of said amplifier;
wherein said base terminals of said third and seventh transistors are connected together and are connected to said collector terminal of said third transistor;
wherein said emitter terminal of said third transistor is connected to said emitter terminal of said first transistor;
wherein said base terminal of said fourth transistor is connected to said base terminal of said eighth transistor and is connected to said collector terminal of said fourth transistor;
wherein said emitter terminal of said fourth transistor is connected to said emitter terminal of said second transistor;
wherein said base terminal of said fifth transistor is connected to said base terminal of said sixth transistor and to said collector terminals of said fifth and sixth transistors forming said output terminal of said amplifier;
wherein said emitter terminals of said fifth and seventh transistors are connected together;
wherein said emitter terminals of said sixth and eighth transistors are connected together;
wherein said collector terminal of said first transistor is connected to said input terminal of said second current mirror;
wherein said collector terminal of said second transistor is connected to said input terminal of said first current mirror;
wherein said output terminal of said first current mirror is connected to said collector terminal of said third transistor;
wherein said output terminal of said second current mirror is connected to said collector terminal of said fourth transistor;
wherein said collector terminal of said seventh transistor is connected to said first bias source;
wherein said collector terminal of said eighth transistor is connected to said second bias source.

8. A wideband buffer amplifier in accordance with claim 7, wherein said first and second bias sources comprise bias voltage sources.

9. A wideband buffer amplifier, comprising:
a unity gain buffer amplifier including an input terminal and an output terminal;
first and second dependent bias means each including first and second input terminals and an output terminal;
wherein each said dependent bias means further includes at least one source of voltage supply;
wherein said output terminals of said first and second dependent bias means are connected to provide bias current to said unity gain buffer amplifier;
first and second slew current sensing means;
bias source for providing means of setting quiescent current;

said bias source being connected to said first input terminal of each said dependent bias means;

wherein said first and second slew current sensing means are connected to said second input terminals of said first and second dependent bias means, respectively;

wherein when a variable voltage is applied to said input terminal of said unity gain buffer amplifier, said first slew current sensing means is adapted to sense a rate of increase in said voltage and is further adapted to cause said first dependent bias means to be increased in proportion to said rate of increase in said voltage, and said second slew current sensing means is adapted to sense a rate of decrease in said voltage and is further adapted to cause said second dependent bias means to be increased in proportion to said rate of decrease in said voltage;

wherein said buffer amplifier includes first, second, third, fourth, fifth, sixth, seventh and eighth transistors each having collector, emitter and base terminals, and first and second bias sources;

wherein said first, fourth, fifth and eighth transistors are of the PNP type;

wherein said second, third, sixth and seventh transistors are of the NPN type;

wherein said base terminals of said first and second transistors are connected together to form said input terminal of said amplifier;

wherein said base terminals of said third and seventh transistors are connected together and are connected to said collector terminal of said third transistor;

wherein said emitter terminal of said third transistor is connected to said emitter terminal of said first transistor;

wherein said base terminal of said fourth transistor is connected to said base terminal of said eighth transistor and is connected to said collector terminal of said fourth transistor;

wherein said emitter terminal of said fourth transistor is connected to said emitter terminal of said second transistor;

wherein said base terminal of said fifth transistor is connected to said base terminal of said sixth transistor and to said collector terminals of said fifth and sixth transistors forming said output terminal of said amplifier;

wherein said emitter terminals of said fifth and seventh transistors are connected together;

wherein said emitter terminals of said sixth and eighth transistors are connected together;

wherein said collector terminal of said first transistor is connected to said second input terminal of said second dependent bias means;

wherein said collector terminal of said second transistor is connected to said second input terminal of said first dependent bias means;

wherein said output terminal of said first dependent bias means is connected to said collector terminal of said third transistor;

wherein said output terminal of said second dependent bias means is connected to said collector terminal of said fourth transistor;

wherein said collector terminal of said seventh transistor is connected to said first bias source;

wherein said collector terminal of said eighth transistor is connected to said second bias source.

10. A wideband buffer amplifier, comprising:

a unity gain buffer amplifier including an input terminal and an output terminal;

first and second dependent bias means each including first and second input terminals and an output terminal;

wherein each said dependent bias means further includes at least one source of voltage supply;

wherein said output terminals of said first and second dependent bias means are connected to provide bias current to said unity gain buffer amplifier;

first and second slew current sensing means;

bias source for providing means of setting quiescent current;

said bias source being connected to said first input terminal of each said dependent bias means;

wherein said first and second slew current sensing means are connected to said second input terminals of said first and second dependent bias means, respectively;

wherein when a variable voltage is applied to said input terminal of said unity gain buffer amplifier, said first slew current sensing means is adapted to sense a rate of increase in said voltage and is further adapted to cause said first dependent bias means to be increased in proportion to said rate of increase in said voltage, and said second slew current sensing means is adapted to sense a rate of decrease in said voltage and is further adapted to cause said second dependent bias means to be increased in proportion to said rate of decrease in said voltage;

wherein said buffer amplifier includes first, second, third, and fourth transistors each having collector, emitter and base terminals and first and second bias sources;

wherein said base terminals of said first and second transistors are connected together to form said input terminal of said amplifier;

wherein said emitter terminal of said first transistor is connected to said base terminal of said third transistor;

wherein said emitter terminal of said second transistor is connected to said base terminal of said fourth transistor;

wherein said emitter terminals of said third and fourth transistors are connected together to form said output terminal of said amplifier;

wherein said collector terminal of said third transistor is connected to said first bias source;

wherein said collector terminal of said fourth transistor is connected to said second bias source;

wherein said collector terminal of said first transistor is connected to said second input terminal of said second dependent bias means;

wherein said collector terminal of said second transistor is connected to said second input terminal of said first dependent bias means;

wherein said output terminal of said first dependent bias means is directly connected to said emitter terminal of said first transistor;

wherein said output terminal of said second dependent bias means is directly connected to said emitter terminal of said second transistor.

11. A wideband buffer amplifier, comprising:

a unity gain buffer amplifier having an input terminal for receiving an input signal and an output terminal, said unity gain buffer amplifier includes a first transistor having a first collector and a second transistor having a second collector;

first means for sensing a rate of increase in said input signal from said second collector of said second transistor and proportionately increasing a bias of said first transistor of said unity gain buffer amplifier at a first output port;

second means for sensing a rate of decrease in said input signal from said first collector of said first transistor and proportionately increasing a bias of said second transistor of said unity gain buffer amplifier at a second output port;

wherein said first output port has a first direct connection with said first transistor and said second output port has a second direct connection with said second transistor.

12. A wideband buffer amplifier, as claimed in claim 11, wherein:
at least one of said first and second means includes a current mirror.

13. A wideband buffer amplifier, as claimed in claim 11, wherein:
said unity gain buffer amplifier includes four transistors.

14. A wideband buffer amplifier, as claimed in claim 11, wherein:
at least one of said first and second means includes a Wilson current monitor.

15. A wideband buffer amplifier, as claimed in claim 11, wherein:
at least one of said first and second means includes a buffered current mirror.

16. A wideband buffer amplifier, as claimed in claim 11, wherein:
at least one of said first and second means includes a buffered Wilson current mirror.

17. A wideband buffer amplifier, as claimed in claim 11, wherein:
said unity gain buffer includes eight transistors.

18. A wideband buffer amplifier, comprising:
a unity gain buffer amplifier having an input terminal for receiving an input signal and an output terminal;

first means for sensing a rate of increase in said input signal and proportionately increasing a bias of said unity gain buffer amplifier at a first output port;

second means for sensing a rate of decrease in said input signal and proportionately increasing a bias of said unity gain buffer amplifier at a second output port;

wherein at least one of said first and second output ports has a direct connection with said unity gain buffer amplifier;

said unity gain buffer amplifier includes a diode and a transistor, said diode connected to said transistor, and said transistor providing information relating to said input signal to one of said first and second means; and said direct connection extends between said at least one of said first and second output ports and said diode.

19. A wideband buffer amplifier, comprising:
a unity gain buffer amplifier having an input terminal for receiving an input signal and an output terminal;

first means for sensing a rate of increase in said input signal and proportionately increasing a bias of said unity gain buffer amplifier at a first output port;

second means for sensing a rate of decrease in said input signal and proportionately increasing a bias of said unity gain buffer amplifier at a second output port;

wherein at least one of said first and second output ports has a direct connectin with said unity gain buffer amplifier;

said unity gain buffer amplifier includes a diode, a first transistor and a second transistor, said diode connected to said first transistor, said first transistor providing information relating to said input signal to one of said first and second means; and said direct connectin extends between said at least one of said first and second output ports and said diode.

20. A wideband buffer amplifier, comprising:
a unity gain buffer amplifier having an input terminal for receiving an input signal and an output terminal;

first means for sensing a rate of increase in said input signal and proportionately increasing a bias of said unity gain buffer amplifier at a first output port;

second means for sensing a rate of decrease in said input signal and proportionately increasing a bias of said unity gain buffer amplifier at a second output port;

wherein at least one of said first and second output ports has a direct connection with said unity gain buffer amplifier;

said unity gain buffer amplifier includes a diode, a first transistor and a second transistor, said diode connected to said first transistor, said first transistor providing information relating to said input signal to one of said first and second means and said second transistor providing current to said output terminal; and said direct connection extends between said at least one of said first and second output ports, said first transistor and said second transistor.

21. A wideband buffer amplifier, comprising:
a unity gain buffer amplifier including an input terminal and an output terminal;

first and second dependent bias means each including a first input terminal and an output terminal;

wherein at least one of said first and second dependent bias means includes a second input terminal;

wherein said first dependent bias means further includes a first source of voltage supply and said second dependent bias means further includes a second source of voltage supply;

wherein said output terminals of said first and second dependent bias means are connected to provide bias current to said unity gain buffer amplifier;

first and second slew current sensing means;

bias source for providing means of setting quiescent current;

said bias source being connected to said second input terminal of at least one of said dependent bias means;

wherein said first and second slew current sensing means are connected to said first input terminals of said first and second dependent bias means, respectively;

wherein when a variable voltage is applied to said input terminal of said unity gain buffer amplifier, said first slew current sensing means is adapted to sense a rate of increase in said voltage and is further adapted to cause said first dependent bias means to be increased in proportion to said rate of increase in said voltage, and said second slew current sensing means is adapted to sense a rate of decrease in said voltage and is further adapted to cause said second dependent bias means to be increased in proportion to said rate of decrease in said voltage;

wherein said first dependent bias means includes first, second, third, and fourth transistors each having collector, base, and emitter terminals;

wherein said first dependent bias means includes bias current means for said fourth transistor;

wherein, in said first dependent bias means, said base terminals of said first, second and third transistors are connected together with said collector terminal of said second transistor and with said emitter terminal of said fourth transistor and with said bias current means to form said first input terminal of said first dependent bias means;

wherein said collector terminal of said third transistor is connected to said base terminal of said fourth transistor to form said second input terminal of said first dependent bias means;

wherein said collector terminal of said first transistor comprises said output terminal of said first dependent bias means;

wherein said emitter terminals of said first, second, and third transistors of said first dependent bias means are connected to said first source of voltage supply and said collector terminal of said fourth transistor of said first dependent bias means is connected to said second source of voltage supply; and wherein said first and second sources of voltage supply are adapted to bias said transistors.

22. A wideband buffer amplifier in accordance with claim 21, wherein:

said bias current means for said fourth transistor comprises (a) a fifth transistor including collector, base and emitter terminals, and further comprises (b) resistor means having first and second terminals;

wherein said first terminal of said resistor means is connected to said first source of voltage supply;

wherein said base and collector terminals of said fifth transistor are connected to said emitter terminal of said fourth transistor; and wherein said emitter terminal of said fifth transistor is connected to said second terminal of said resistor means.

23. A wideband buffer amplifier, comprising:

a unity gain buffer amplifier having an input terminal for receiving an input signal and an output terminal, said unit gain buffer amplifier including a first transistor having a collector and a first base, and a second transistor having a second base, wherein said first base and said second base are operatively connected to said input terminal;

first means for sensing, in response to information provided by said collector of said first transistor, a rate of increase in said input signal and proportionately increasing a bias of said second transistor of said unity gain buffer amplifier; and second means for providing a bias of said first transistor, said second means having a third transistor;

wherein said third transistor is directly connected to said first transistor.

24. A wideband buffer amplifier, comprising:

a unity gain buffer amplifier having an input terminal for receiving an input signal and an output terminal, said unity gain buffer amplifier including a first transistor having a collector and a first base, and a second transistor having a second base, wherein said first base and said second base are operatively connected to said input terminal;

first means for sensing, in response to information provided by said collector of said first transistor, a rate of decrease in said input signal and proportionately increasing a bias of said second transistor of said unity gain buffer amplifier; and second means for providing a bias of said first transistor, said second means having a third transistor;

wherein said third transistor is directly connected to said first transistor.

* * * * *